United States Patent
Zibik et al.

(10) Patent No.: US 12,095,232 B2
(45) Date of Patent: Sep. 17, 2024

(54) CONTROL OF CURRENT SPREAD IN SEMICONDUCTOR LASER DEVICES

(71) Applicant: II-VI Delaware, Inc., Wilmington, DE (US)

(72) Inventors: Evgeny Zibik, Zurich (CH); Wilfried Maineult, Zurich (CH)

(73) Assignee: II-VI Delaware, Inc., Wilmington, DE (US)

( * ) Notice: Subject to any disclaimer, the term of this patent is extended or adjusted under 35 U.S.C. 154(b) by 134 days.

(21) Appl. No.: 17/495,227

(22) Filed: Oct. 6, 2021

(65) Prior Publication Data
US 2023/0104488 A1    Apr. 6, 2023

(51) Int. Cl.
*H01S 5/22* (2006.01)
*H01S 5/10* (2021.01)
*H01S 5/20* (2006.01)
*H01S 5/32* (2006.01)
*H01S 5/323* (2006.01)

(52) U.S. Cl.
CPC .......... *H01S 5/2054* (2013.01); *H01S 5/1039* (2013.01); *H01S 5/22* (2013.01); *H01S 5/3211* (2013.01); *H01S 5/323* (2013.01)

(58) Field of Classification Search
CPC .............................. H01S 5/2054; H01S 5/2205
See application file for complete search history.

(56) References Cited

U.S. PATENT DOCUMENTS

| | | | |
|---|---|---|---|
| 4,149,175 A | 4/1979 | Inoue et al. | |
| 4,169,997 A * | 10/1979 | Logan | H01S 5/223 257/E33.005 |
| 5,493,577 A * | 2/1996 | Choquette | H01S 5/18313 372/99 |
| 6,075,802 A | 6/2000 | Stolz et al. | |
| 8,548,023 B2 * | 10/2013 | Sonobe | H01S 5/168 372/46.012 |
| 2010/0208760 A1 | 8/2010 | Yoshikawa | |
| 2018/0019573 A1 * | 1/2018 | Wang | H01S 5/026 |
| 2021/0194216 A1 * | 6/2021 | Maros | H01S 5/3095 |

FOREIGN PATENT DOCUMENTS

| | | | |
|---|---|---|---|
| CN | 112636175 A | * | 4/2021 |
| JP | S58166788 | | 10/1983 |
| JP | H08195525 | | 7/1996 |

OTHER PUBLICATIONS

Hamada, Ken et al., "Outlook Bright For High-Power Semiconductor Lasers", JEE Journal of Electronic Engineering, DEMPA Publications Inc., Tokyo JP, vol. 25, No. 260, Aug. 1, 1988, pp. 41-43.

* cited by examiner

*Primary Examiner* — Tod T Van Roy
*Assistant Examiner* — Stephen Sutton Kotter
(74) *Attorney, Agent, or Firm* — Wendy W. Koba (57) ABSTRACT

A semiconductor laser is formed to include a current blocking layer that is positioned below the active region of the device and used to minimize current spreading beyond the defined dimensions of an output beam's optical mode. When used in conjunction with other current-confining structures typically disposed above the active region (e.g., ridge waveguide, electrical isolation, oxide aperture), the inclusion of the lower current blocking layer improves the efficiency of the device. The current blocking layer may be used in edge-emitting devices or vertical cavity surface-emitting devices, and also functions to improve mode shaping and reduction of facet deterioration by directing current flow away from the facets.

9 Claims, 12 Drawing Sheets

CONTROL OF CURRENT SPREAD IN SEMICONDUCTOR LASER DEVICES

TECHNICAL FIELD

The present invention relates to semiconductor lasers and, more particularly, to the inclusion of a current restricting layer beneath the active region for directing electron flow toward the optical mode area.

BACKGROUND OF THE INVENTION

Electrically-pumped semiconductor lasers generate light output in response to current flowing between n-type and p-type ohmic contacts deposited on the opposite sides of the light-generating active region of the semiconductor structure. In most cases, the current flow is restricted to a certain portion of the active region, defining an emission area where the light is preferably generated. There are several approaches in the prior art for providing lateral confinement of current flow to the preferred area within the active region. For example, the cladding-waveguiding region between the p-type ohmic contact and the active region can be shaped to form a ridge structure that physically confines the current to a defined width of the ridge. Alternatively, one or more layers of the semiconductor material forming the p-type cladding can be modified in composition to exhibit regions of higher resistivity (e.g., buried heterostructures for edge-emitting devices or oxide apertures for vertical cavity devices) that also function to confine current flow to the remaining area of lower resistivity.

However, these approaches only address the confinement of current from the top side (i.e., above the location of the active region) typically from the p-type ohmic contact toward the active region. To meet stringent laser reliability requirements, it is undesirable to position current confinement structures in close proximity to the active region during the fabrication process, since the long-term reliability can be compromised. As a result, there is always a finite spacing between the current confinement structure and the active region, with the possibility of current spreading in this area between the two laser features. Moreover, the vertical dimension of this spacing between the active region and the current confinement structure is challenging to control during the fabrication of the semiconductor laser device, and may result in significant current spreading such that the pump area in the active region becomes larger than the defined central region for the generated optical mode. The over-sized pump area reduces the efficiency of the laser (i.e., lower conversion efficiency from current to photons) and results in other unwanted detrimental effects, such as fluctuations in optical output power (referred to as "kinks"), spatial hole burning that impacts the physical properties of the semiconductor material, and the like.

SUMMARY OF THE INVENTION

Various problems associated with undesirable current spreading in proximity to the active region of a semiconductor laser is addressed by the present invention through the use of an electron flow restrictor positioned below the active region of the laser device (i.e., along the path between the n-type ohmic contact and the active region). The electron flow restrictor takes the form of a highly resistive layer with a central opening that may be substantially aligned with the location of the optical mode of the laser's output emission. When used in combination with various prior art methods of directing current flow above the active region, the electron flow restrictor functions to direct the electron flow away from the edges of the semiconductor structure, and instead toward the central region.

An exemplary embodiment of the present invention may take the form of a semiconductor laser comprising an active region disposed between a lower (n-type) cladding layer and an upper (p-type) cladding layer. The lower cladding layer is supported by a semiconductor substrate, with ohmic contacts on the upper cladding layer and substrate used to pass a current through the active region. In accordance with the principles of the present invention, the semiconductor layer includes a current blocking layer disposed between the lower cladding layer and the active region. The current blocking layer comprises a high resistivity material and is formed to include a low resistivity central area substantially coinciding in location and topology with the light-generating defined area of the active region, guiding upward current flow from the second ohmic contact away from the high resistivity regions of the current blocking layer and toward the low resistivity central area.

A semiconductor laser formed in accordance with the principles of the present invention to include a current blocking layer may be either an edge-emitting laser device or a vertical cavity surface-emitting device, and may be formed of any of the various combinations of III-V material used in their formation.

Other and further aspects and embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
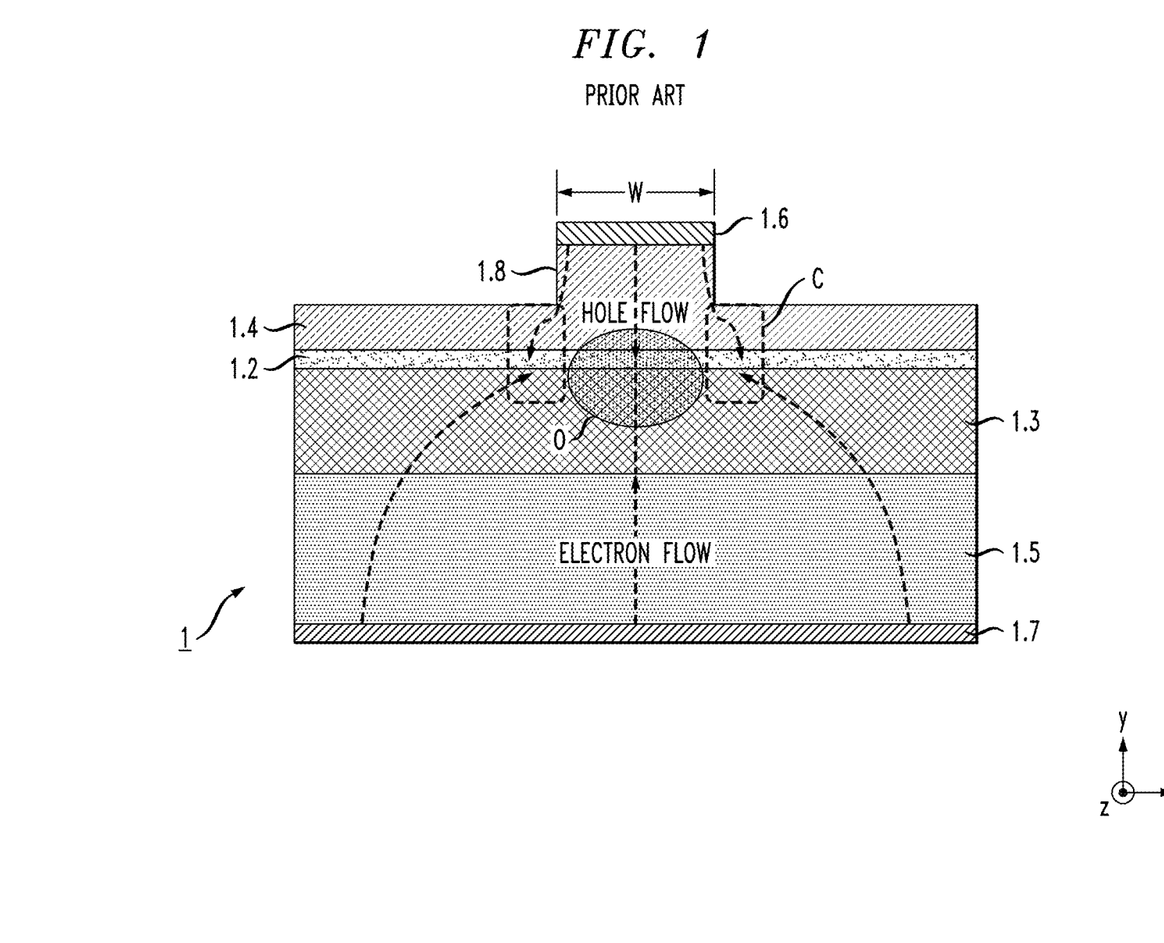
FIG. 1 illustrates a prior art edge-emitting semiconductor laser, showing the location of the current spreading areas adjacent to the active region.

Prior to describing the inventive details related to improved current confinement in semiconductor lasers, the immediately following paragraphs and associated FIG. 1 present a description of a typical semiconductor laser structure and how the unwanted current spreading develops.

In particular, FIG. 1 illustrates a prior art edge-emitting semiconductor laser 1 that includes an active region 1.2 positioned between a lower cladding-waveguide layer 1.3 and an upper cladding-waveguide layer 1.4 (upper cladding-waveguide layer 1.4 is formed to exhibit an opposite conductivity type to lower layer 1.3). Conventional arrangements are formed to utilize an n-type cladding-waveguide layer below active region 1.2 and a p-type cladding-waveguide layer above active region 1.2. This disposition of conductivity types will be carried forward throughout the remainder of the discussion of both the prior art and the present invention, with the understanding that it is possible to reverse the positions of the n-type and p-type materials. Additionally, for the sake of brevity, both layers 1.3 and 1.4 will be simply referred to as "cladding layers" (and similarly for the following discussion of the invention).

Continuing with the description of prior art edge-emitting semiconductor layer 1, n-type cladding layer 1.3 is shown as supported on an n-type substrate 1.5. The ohmic contacts used to pass a current through laser 1 are shown as a p-side ohmic contact 1.6 disposed on a top surface of p-type cladding layer 1.4 and an n-type ohmic contact 1.7 disposed across the exposed bottom surface of substrate 1.5. In this common example, p-type cladding layer 1.4 is formed to include a ridge structure 1.8 to physically confine the current (here, the flow of holes in the p-type direction) through p-type cladding layer 1.4 toward active region 1.2 to an area within the width W of ridge structure 1.8.

While helpful in confining the downward flow of holes toward active region 1.2, there remains the upward flow of electrons from n-type ohmic contact 1.7 through n-type cladding layer 1.3 toward active region 1.2. Lacking confinement, the electron flow is shown in prior art FIG. 1 as creating current spread (in combination with hole flow) in a region C surrounding the desired optical mode location O in the center of active region 1.2. The presence of current spread beyond the desired boundary of the optical mode reduces laser efficiency in terms of conversion efficiency of applied current to generated optical output. That is, the portion of current flow outside of the optical mode area is wasted by either not being converted to light, or forming amplified spontaneous emission (ASE) in an unwanted area outside of the optical mode.

As also mentioned above, the various types of current confinement within the p-side of the laser structure cannot be located too close to the active region, since the process steps associated with creating current confinement may introduce unwanted changes to the underlying active region as a result. Thus, the need to maintain a separation between any p-type current confinement feature and the active region results in the structure as shown in FIG. 1 where there remains an area for spreading of the hole flow before reaching the active region. Current spreading is becoming a limiting factor in achieving performance improvements in semiconductor lasers and needs to be addressed.

Figure 2:
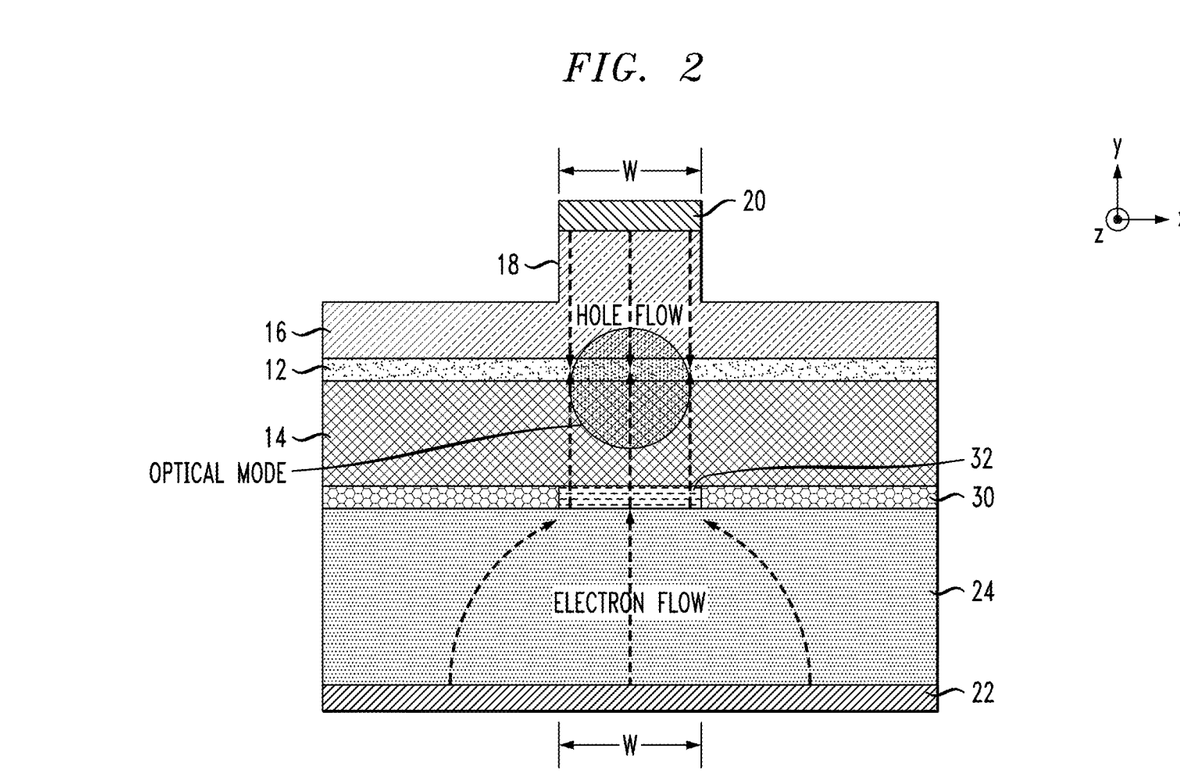
FIG. 2 is a cut-away side view of an edge-emitting semiconductor laser diode formed in accordance with the principles of the present invention to include a current blocking layer.

FIG. 2 is a cut-away side view of an edge-emitting semiconductor laser 10 formed in accordance with the principles of the present invention to include an electron flow restrictor that functions to reduce current spread within the portion of the laser structure below the active region. As with conventional edge-emitting structures, edge-emitting semiconductor laser 10 includes an active region 12 formed between an n-type cladding layer 14 and a p-type cladding layer 16. In this example, a ridge structure 18 is formed within p-type cladding layer 16 to physically confine the flow of holes from a p-side ohmic contact 20 toward active region 12 (upon the application of a proper bias voltage between p-side ohmic contact 20 and an n-side ohmic contact 22).

In accordance with the principles of the present invention, improved current confinement is achieved in edge-emitting semiconductor laser 10 by including current blocking of the upward electron flow within the n-side portion of the laser structure. Here, FIG. 2 illustrates the inclusion of a current blocking layer 30 that is disposed beneath active region 12 (i.e., within the n-type portion of laser 10) that comprises a layer of high resistivity composition, with a central "opening" 32 of low resistivity. As shown, the presence of current blocking layer 30 functions to direct the upward flow of electrons from n-side ohmic contact 20 toward central opening 32, which is particularly located and sized to correspond to a defined area of active region 12 associated with the desired light-generating portion of active region 12 (i.e., the location of the "optical mode" within active region 12).

In accordance with the principles of the present invention, it is preferred that central opening 32 be formed to align with ridge structure 18 (or any other current confinement feature existing within the p-side of the laser). Additionally, central opening 32 is preferred to exhibit a width W substantially the same as ridge structure 18, in order to maximize the overlap between the current's pump area and the defined optical mode size, thus leading to optimum efficiency of operation. Inasmuch as central opening 32 may be created using standard laser fabrication processes, the ability to shape and align central opening 32 with respect to ridge structure 18 is not problematic.

In the particular embodiment of FIG. 2, current blocking layer 30 is formed at an interface between substrate 24 and n-type cladding 14 and may comprise any type of highly-resistive layer (or group of layers) that blocks electron flow in outer regions of n-type cladding layer 14. As will be discussed below in association with a description of different methods of forming current blocking layer 30, blocking layer 30 may comprise a top surface region of substrate 24 that has been subjected to particle bombardment (which is known introduce structural disordering within the crystalline substrate material, thereby increasing its resistivity), or may comprise a layer of highly-doped p-type material that is deposited on substrate 24 prior to initiating the growth of n-type cladding layer 14.

Advantageously, using a current blocking layer that is positioned at the interface between substrate 24 and n-type cladding layer 14 allows for a conventional process steps to be used for the subsequent fabrication of semiconductor laser 10 over current blocking layer 30. As will be discussed below in association with FIGS. 10 and 11 (describing an exemplary fabrication process), by virtue of forming current blocking layer 30 below the device structure, no modification to a typical fabrication sequence is required to create an improved laser structure including a current blocking layer at this interface. While clearly a benefit, the separation between the location of current blocking layer 30 and active region 12 allows for some spreading of electron flow through the thickness of n-type cladding layer 14 (similar to the above-mentioned problem of separation between p-side current confinement structures and active region 12).

Figure 3:
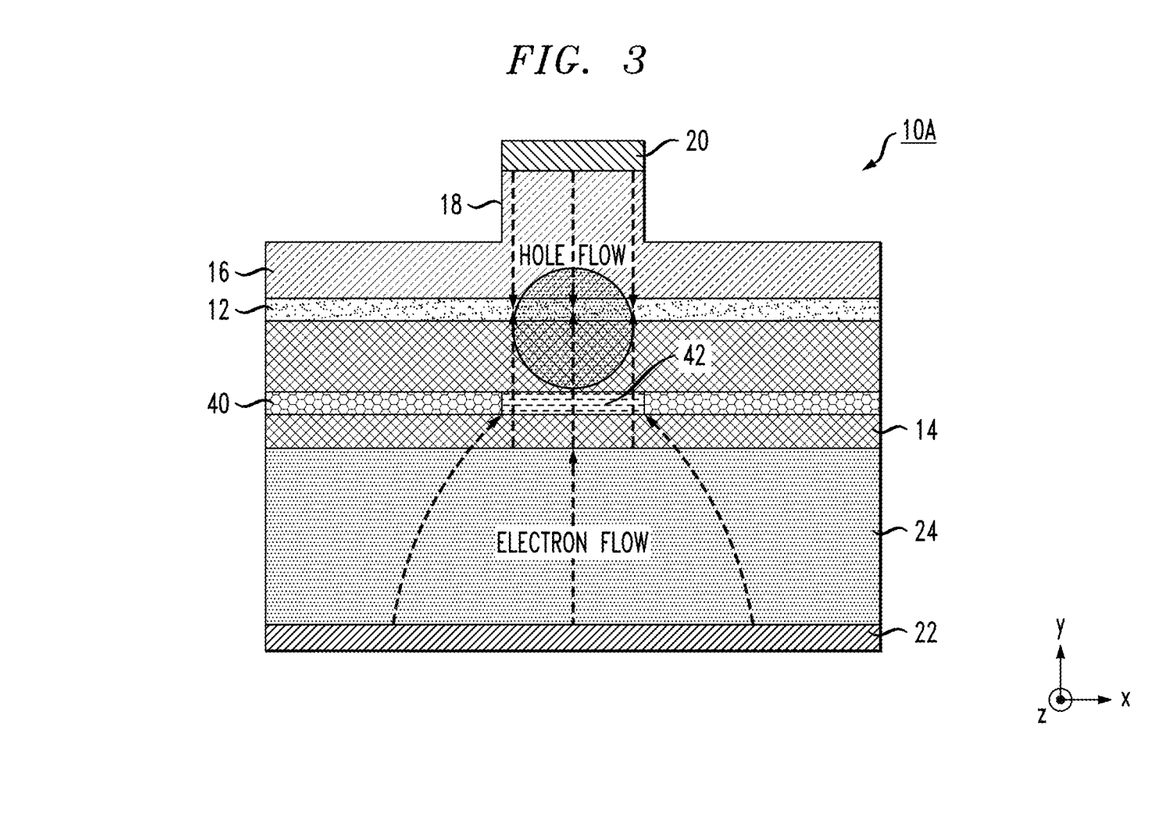
FIG. 3 is a cut-away side view of an alternative embodiment of the edge-emitting semiconductor laser diode of FIG. 2, in this case with the current blocking layer disposed to be embedded within the lower cladding layer of the diode structure.

An alternative embodiment of the inventive edge-emitting semiconductor laser that reduces the possibility of current spreading within the n-side of the laser is shown in FIG. 3. Depicted as edge-emitting semiconductor laser 10A, this embodiment includes the same basic structure as that described above in association with edge-emitting semiconductor laser 10 of FIG. 2. That is, semiconductor laser 10A includes active region 12 disposed between n-type cladding layer 14 and p-type cladding layer 16, the latter including a ridge structure 18 to confine the downward flow of holes from p-side ohmic contact 20 toward active region 12.

In this particular embodiment, a current blocking layer 40 is shown as formed within n-type cladding layer 14 (at times referred to as "embedded" within n-type cladding layer 14) and is therefore positioned in closer proximity to active region 12 than current blocking layer 30 of the embodiment shown in FIG. 2. Similar in form and function to current blocking layer 30, blocking layer 40 includes a central opening 42 that is sized and positioned to control the electron flow upward toward active region 12. By virtue of positioning current blocking layer 40 closer to active region 12 than the embodiment shown in FIG. 2, the amount of current spread that is possible as the electrons flow upward is somewhat reduced in this configuration and, as a result, an edge-emitting semiconductor laser 10A may exhibit improved laser efficiency over the previous embodiment.

Figure 4:
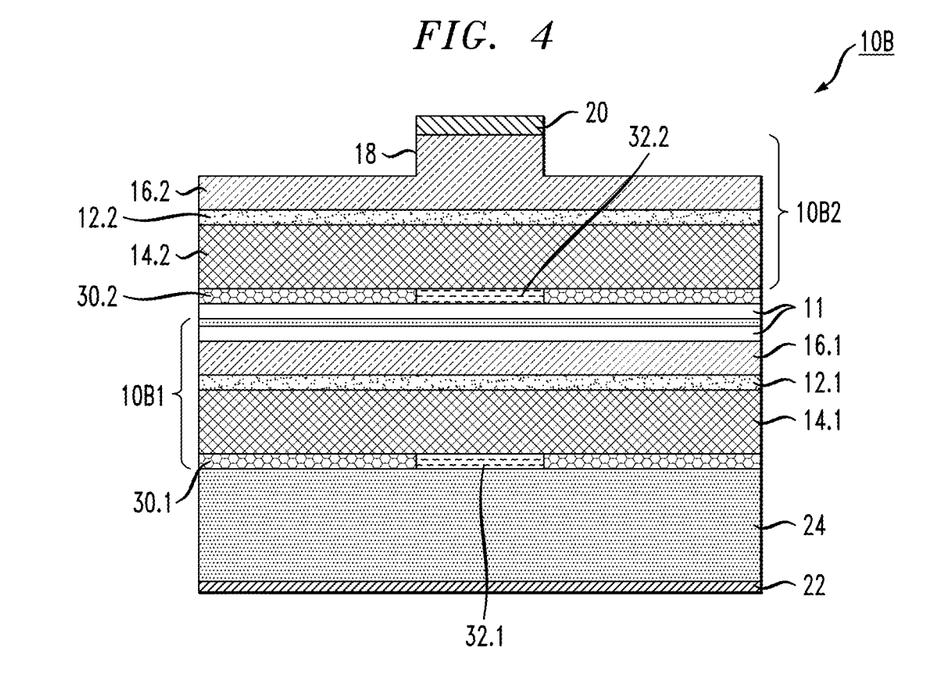
FIG. 4 is a cut-away side view of an exemplary double-junction edge-emitting semiconductor laser diode of the present invention, with a current blocking layer disposed below the active region of each diode junction within this particular structure.

The principles of the present invention may also be applied to a multi-junction semiconductor laser configuration, where the structure is fabricated to include multiple active regions (separated by appropriate n-type and p-type cladding layers) and energized in series to provide a high brightness output beam. FIG. 4 illustrates an exemplary double-junction laser structure 10B, having the same ohmic contacts 20, 22 as described above, with the multi-junction structure fabricated upon n-type substrate 24 (similar to the process described above as well). Double junction laser 10B is shown as comprising a first semiconductor laser 10B1 and a second semiconductor laser 10B2, separated by a tunnel junction element 11. First semiconductor laser 10B1 includes an active region 12.1 disposed between an n-type layer 14.1 and a p-type layer 16.1. Similarly, second semiconductor laser 10B2 includes an active region 12.2 disposed between an n-type layer 14.2 and a p-type layer 16.2. Tunnel junction 11 is positioned between p-type layer 16.1 and n-type layer 14.2.

As obvious from the illustration, the ability to use any kind of physical confinement structure (such as a ridge) within each laser diode is not straightforward in a multi-junction laser diode structure. Therefore, the ability to limit current spread by using a current blocking layer formed in accordance with the present invention is extremely helpful in maintaining laser efficiency. Referring to the arrangement of FIG. 4, a first current blocking layer 30.1 is shown as positioned at the interface between substrate 24 and n-type cladding layer 14.1 (similar to the arrangement of FIG. 2). An additional current blocking layer 30.2 is shown as included within second semiconductor laser 10B2 in this particular structure, and is positioned at the interface between tunnel junction 11 and n-type cladding layer 14.2. While an additional current blocking layer is shown in example of FIG. 4, it is to be understood that a multi-junction semiconductor laser formed in accordance with the principles of the present invention need only include a single current blocking layer (typically disposed between the substrate and the "lowest" laser in the stack) and still exhibit the benefits of current confinement as discussed above. The additional benefits of using multiple current blocking layers may be weighed against the difficulties in interrupting the conventional multi-junction fabrication process to insert the additional current blocking layers.

While the arrangement shown in FIG. 4 comprises a "double" junction semiconductor laser, it is to be understood that the principles of the present invention are equally applicable to any type of multi-junction semiconductor laser (i.e., an N-junction semiconductor laser comprising a plurality of N active regions that are energized in series).

In any of these various edge-emitting semiconductor laser structures as shown in FIGS. 2-4, the inclusion of a current blocking layer below the active region of a semiconductor laser thus reduces current spreading for both electrons and holes, allowing for the design and production of more efficient semiconductor laser devices. It is to be understood that such a laser device formed in accordance with the principles of the present invention may be composed of any of the suitable material combinations typically used for these devices such as, but not limited to, GaAs-based laser devices, InP-based laser devices, GaN-based laser devices, and the like. Moreover, as will be discussed below in detail in association with FIGS. 8 and 9, the current blocking principles of the present invention are as applicable to a vertical cavity laser structure as to the edge-emitting lasers 10, 10A and 10B described above.

Beyond the primary benefit of controlling current spread to improve laser efficiency, the inclusion of a current blocking layer to restrict electron flow in the manner described above may also be useful in providing facet protection for edge-emitting semiconductor laser devices, where the dimensions of the restrictor can be configured to direct flow away from the facets.

In particular, AlGaAs/GaAs-based edge-emitting lasers are known to suffer from catastrophic mode destruction (CMD) at the facet surfaces (attributed to the presence of Al and the possibility of oxidation occurring along the facets). In many cases, additional facet passivation or non-absorbing regions are used to minimize the interaction. While intentional shaping the p-side ohmic contact electrode to terminate at a recessed location with respect to the facet (i.e., creating "unpumped" end sections (USEs)) has been found to provide a degree of current shaping that protects the facets, the utilization of the current blocking structure of the present invention enhances the result.

Figure 5:
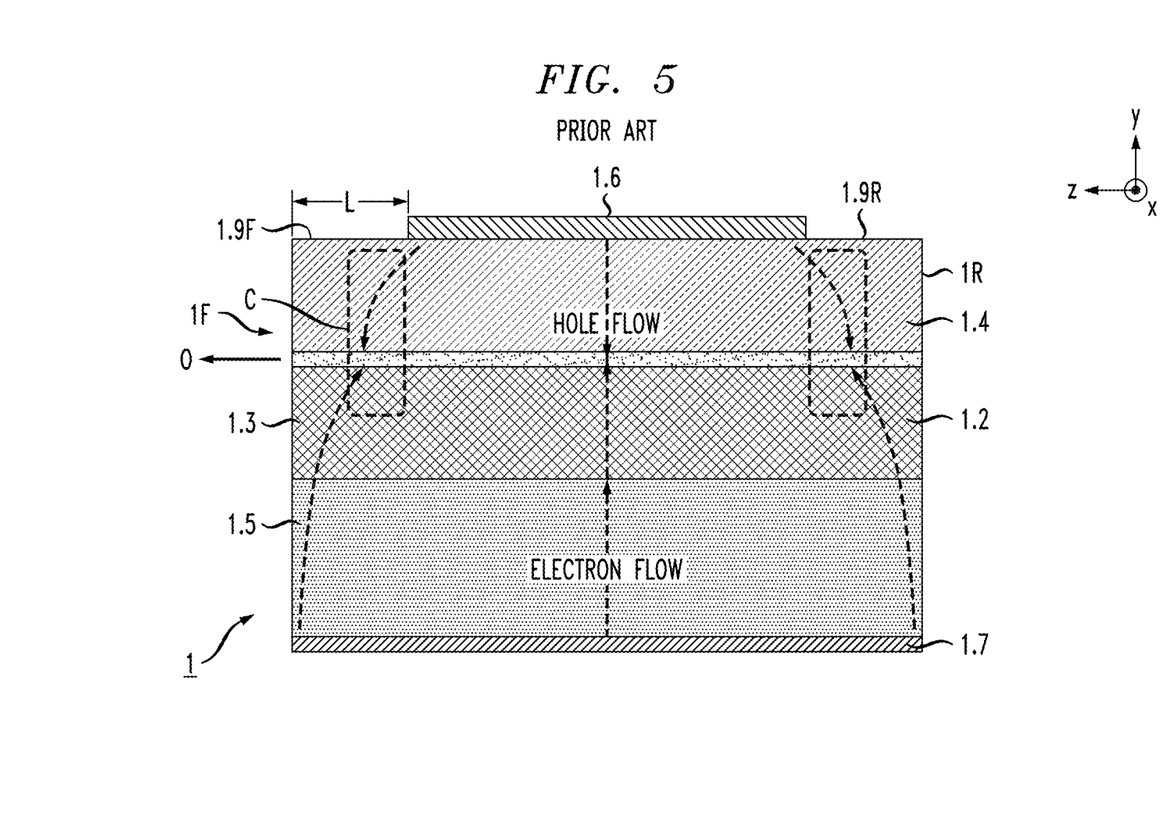
FIG. 5 is a cut-away longitudinal view of the prior art edge-emitting semiconductor laser diode of FIG. 1, illustrating in this view the inclusion of "unpumped" end sections to reduce deterioration of the laser diode's front and rear facets.

FIG. 5 is a cut-away longitudinal view of prior art edge-emitting semiconductor laser 1 of FIG. 1, where this view is projected in the y-z and shows the direction of light emission from a front facet 1F and an intentional recessed shaping of p-side ohmic contact 1.6 to create an unpumped end section 1.9F adjacent to front facet 1F. A similar shaping at the opposing end of p-side ohmic contact 1.6 creates an unpumped end section 1.9R adjacent to a rear facet 1R of semiconductor laser 1. This view is in contrast to that of FIG. 1, which is an "end" view in the x-y plane of the structure (with the longitudinal z-axis propagation direction of the light beam depicted by the "optical mode" and thus exiting out of the page of the drawing).

Returning to the discussion of FIG. 5, facet protection is provided in the prior art by forming p-type ohmic contact 1.6 to be somewhat shortened and not extend along the complete longitudinal extent of laser 1. The recessed locations of the edges of p-type ohmic contact 1.6 with respect to facets 1F, 1R limit the possibility of current flowing on the surface of p-type cladding 1.4, where the electrons and holes otherwise recombine non-radiatively, producing excessive heat that may result in damage to the facet (i.e., loss of reflectivity at the facet).

Unfortunately, current spreading (as discussed above in association with FIG. 1) also occurs along the longitudinal (z-axis) direction surrounding active region 1.2, as shown by regions C in FIG. 5. Therefore, in order to ensure that end sections 1.9F, 1.9R are beyond the boundary of potential current spread and remain unpumped, they must be relatively long (or, p-type ohmic contact 1.6 be relatively short in length, or both). For high power edge emitting lasers, unpumped end sections with a length L in excess of 100 μm is typical.

Figure 6:
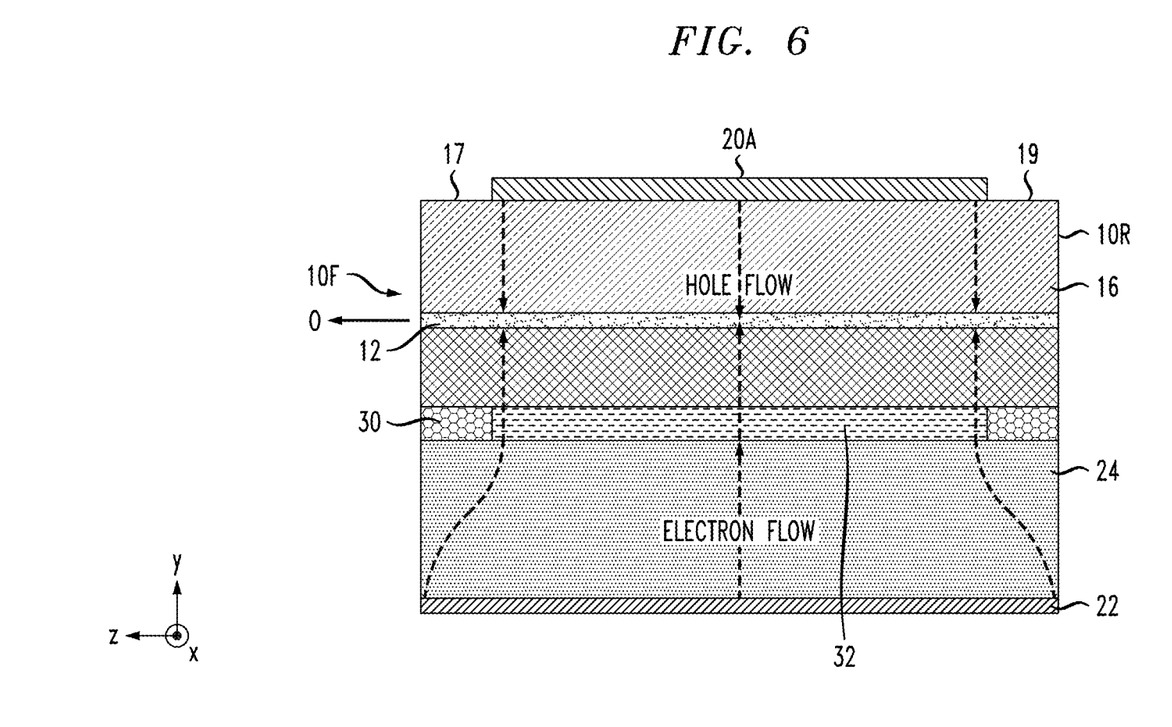
FIG. 6 is a cut-away longitudinal view of an inventive edge-emitting semiconductor laser diode (similar to that of FIG. 2), with the topology of the current blocking layer designed to minimize the presence of unwanted current at the front and rear facets of the laser diode.

FIG. 6 is a longitudinal view of exemplary edge-emitting semiconductor laser 10 of FIG. 2, with the presence of current blocking layer 30 shown as improving facet protection and allowing for relatively shorter unpumped end sections to be used. It is to be understood that the view shown in FIG. 6 is in the y-z plane of the structure, with the optical output O shown as exiting from a front facet 10F of laser 10. A rear facet 10R is also shown. The longitudinal view shown in FIG. 5 is in contrast to end views of FIGS. 2, 3 and 4, which are in the x-y plane of the structure (with the longitudinal z-axis propagation direction of the light beam thus exiting out of the page of the drawing).

Continuing with the description of FIG. 6, edge-emitting laser 10 is shown as comprising the same basic structure as that described above in association with FIG. 2. Evident in this view is that p-side ohmic contact 20A does not extend along the entire longitudinal span of the device, but is truncated to define unpumped end sections 17, 19 adjacent to companion laser facets 10F and 10R, respectively. Unpumped end sections 17 and 19 are intended to prevent current flow on the surface of p-cladding layer 16, where the electrons and holes otherwise recombine non-radiatively, producing excessive heat which results in mirror damage.

The inclusion of current blocking layer 30 below active region 12, in accordance with the principles of the present invention, enhances the current confinement in a manner that supplements the facet protection provided by unpumped end sections 17, 19. In this view, opening 32 within current blocking layer 30 is shown as terminating in substantial alignment with the front and back edges of p-type ohmic contact 20A. As a result, the upward electron flow will overlap with the downward hole flow in a manner that creates little, if any, current spread beyond the defined optical mode. By virtue of including current blocking layer 30, UESs 17, 19 may be reduced in length, again improving the performance of the edge-emitting laser, as more material is used for the amplification.

An additional benefit of including a current blocking layer beneath the active region of an edge-emitting semiconductor laser is the possibility of using this feature to control the size of the optical mode in a single mode device. Various prior art single mode edge-emitting lasers require the use of specially-shaped ridge structures that include longitudinal tapers/curves/flares, with a wider ridge width in the portion of the laser operating as the amplifier and a thinner ridge width in the operation of the laser operating as the mode filter. Unfortunately, this type of structure is known to exhibit kinks from spatial hole burning at specific current/temperature conditions. By tailoring the current distribution in the longitudinal direction through the use of a "shaped" current blocking layer, it is possible to suppress kink occurrence in the first instance.

Figure 7:
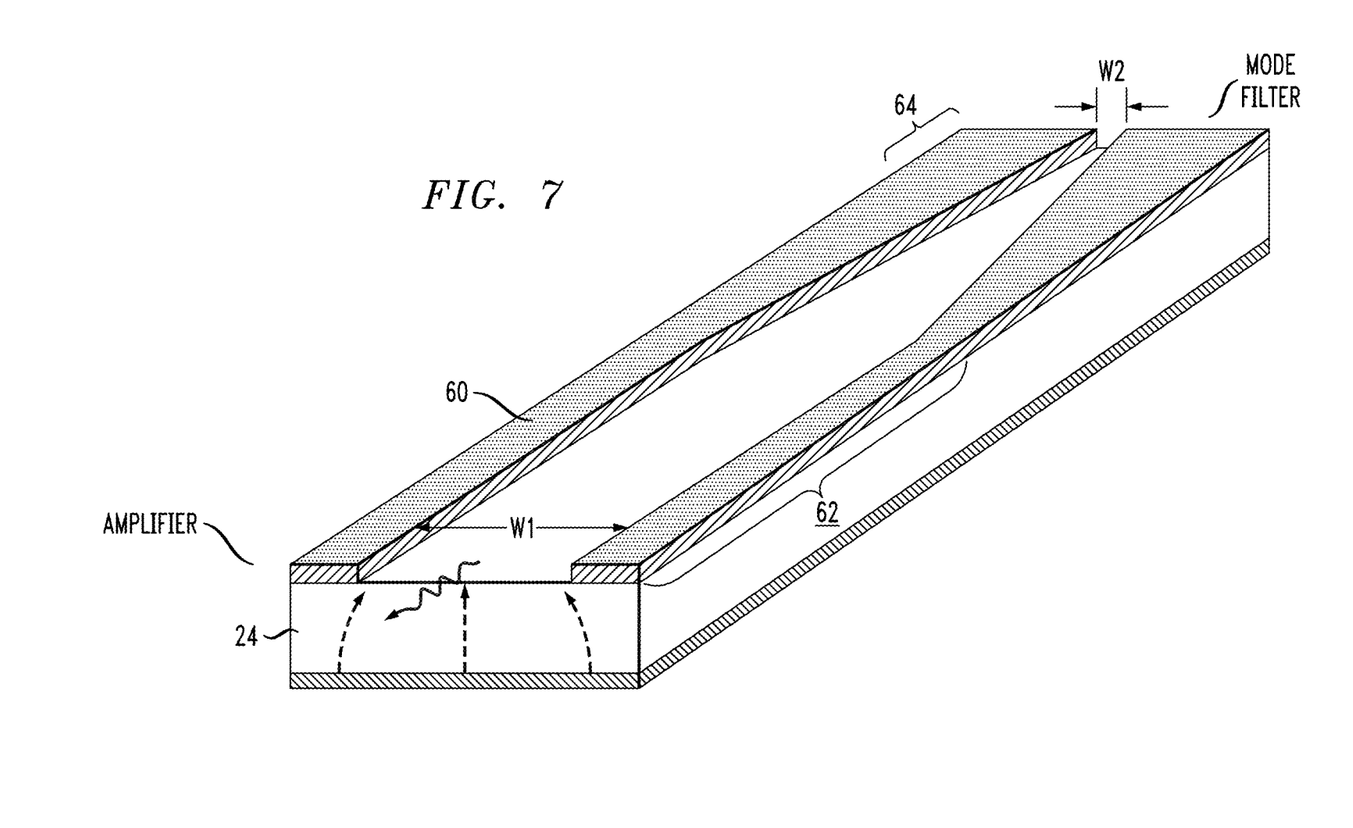
FIG. 7 is an isometric view of an exemplary current blocking layer of the present invention, in this case exhibiting a tapered central opening between the front facet and rear facet, the tapering used to assist in controlling the size of the optical mode exiting the laser in its final form.

FIG. 7 is a top isometric view of a processed current blocking layer 60 (in this case, a patterned surface portion of substrate 24 that has been subjected to proton bombardment). As shown, substrate 24 has been patterned and etched, subsequent to the bombardment, to create a current blocking layer 60 having a larger width W1 in an area 62 where amplification occurs, and tapering into a smaller width W2 in an opposing area 64 that functions as a mode filter. Again, this restriction of electron flow is preferably used in combination with confinement of hole flow downward from the top layer of the device to optimize the shaping of the optical mode.

Figure 8:
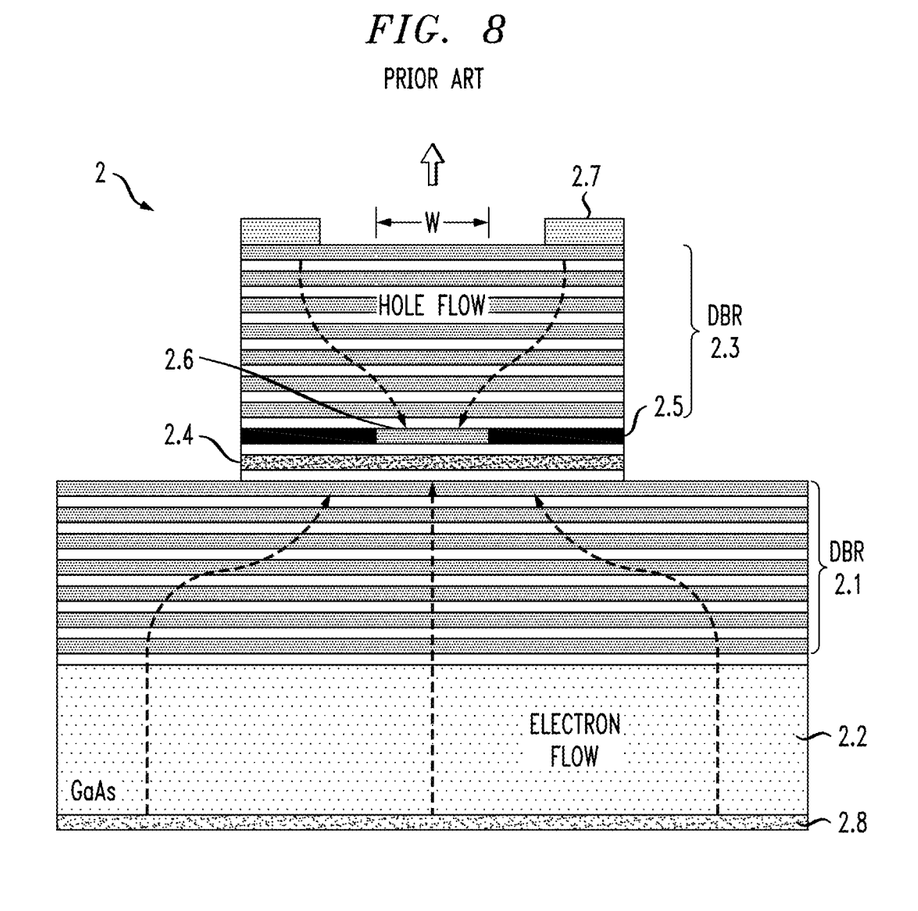
FIG. 8 is a simplified, cut-away side view of a typical prior art vertical cavity surface-emitting laser (VCSEL)

As mentioned above, the benefit of including a current blocking layer below the active region also applies to vertical cavity-based laser structures. Current spreading is also a concern in high power arrangements vertical cavity surface emitting lasers (VCSELs). FIG. 8 is a simplified cut-away view of a conventional prior art VCSEL 2, which includes a first DBR 2.1 that is formed on a substrate 2.2. A second (opposing) DBR 2.3 is separated from first DBR 2.1 by an active region 2.4, formed as a multiple quantum well (MQW) structure. The prior art VCSEL structure 2 of FIG. 8 also includes a current confinement structure in the form of an oxide aperture layer 2.5 (or, perhaps, a lithographically-defined aperture), which is located within second DBR 2.3, as shown, and formed in a manner well-known in the art. The presence of an aperture 2.6 within second DBR 2.3 confines the downward flow (typically, the flow of holes) toward active region 2.4. A first electrode 2.7 for energizing VCSEL 2 is shown as positioned at the top of second DBR 2.3 (and will generally take the place of a circular electrode positioned around the periphery of the cylindrical mesa structure of second DBR 2.3). A second electrode 2.8 is shown as disposed across the bottom surface of substrate 2.2.

As with the edge-emitting laser structure of prior art FIG. 1, prior art VCSEL device as shown in FIG. 8 does not include any type of current confinement within the n-type first DBR 2.1. Thus, current spreading takes place in the electron flow upward from first DBR 2.2 toward active region 2.4, again impacting the efficiency of the laser by virtue of the current pumping region extending beyond the defined area of the optical mode field.

Figure 9:
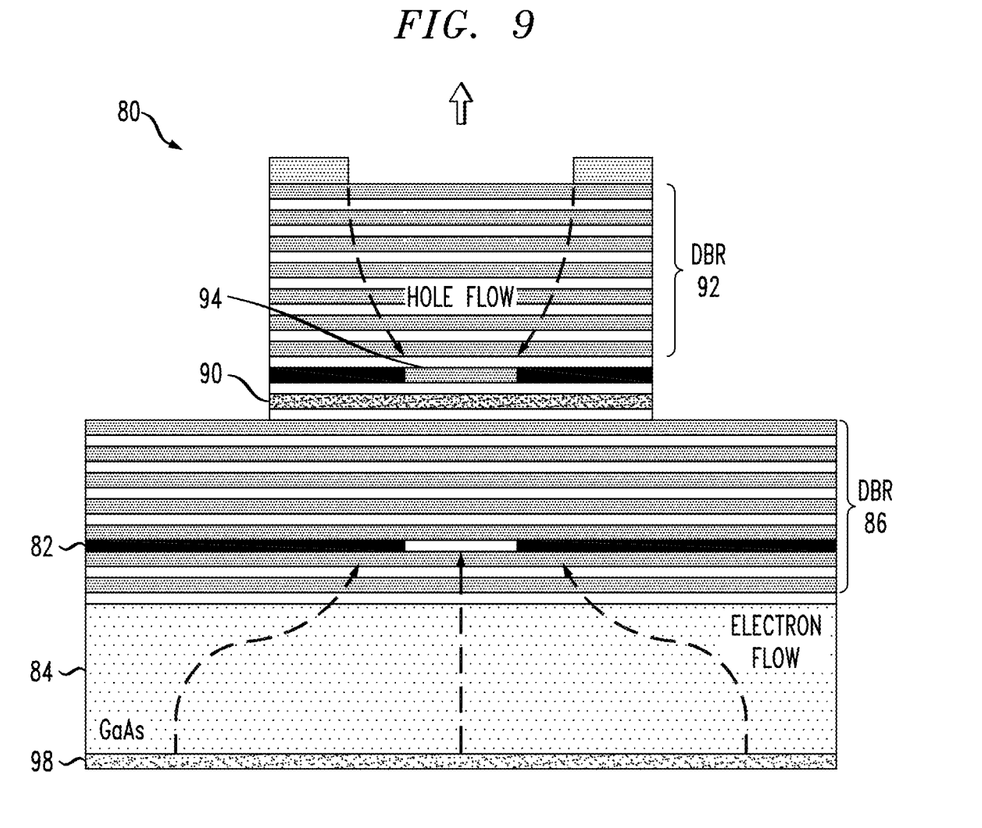
FIG. 9 is a simplified, cut-away side view of a VCSEL formed to include a current blocking layer in accordance with the principles of the present invention.

FIG. 9 illustrates an exemplary VCSEL device 80 formed in accordance with the present invention to include a current blocking layer 82 that is formed at an interface between a substrate 84 and an n-type DBR 86. A conventional active region 90, covered by a p-type DBR 92 is used to complete the structure, with an oxide aperture 94 typically included in p-type DBR 92 to confine the flow of holes to the central region of the structure. A first electrical contact 96 is disposed over p-type DBR 92 and a second electrical contact 98 is disposed over the bottom surface of substrate 84. The presence of current blocking layer 82 functions to direct the flow of electrons from substrate 84 into an interior portion of n-type DBR 86, further confining the presence of the carriers within a central portion of active region 90.

As mentioned above, different fabrication methods and materials may be used to form the inventive current blocking layer in position below the active region of the semiconductor laser (either edge-emitting or VCSEL structure).

Figure 10:
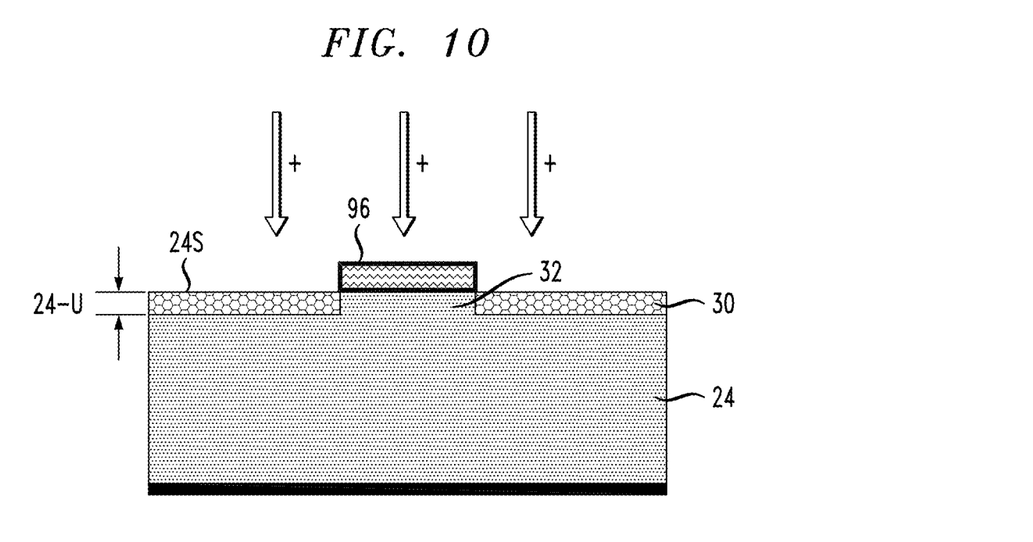
FIG. 10 depicts an initial set of fabrication steps that may be used to form a current blocking layer as part of an edge-emitting, current-confining semiconductor laser diode in accordance with the principles of the present invention, in this example where the current blocking layer is formed on an exposed surface of the semiconductor substrate.

FIG. 10 illustrates an initial set of fabrication steps associated with the formation of current blocking layer 30, as shown in FIG. 2. Substrate 24 is initially patterned to protect the area that will ultimately form opening 32. Here, a mask 96 is shown as positioned over the area to be defined as opening 32. With mask 90 in place, surface 24S of n-type substrate 24 may be subjected to a proton bombardment process, which is known to disrupt the crystallographic structure of the semiconductor material and increase its resistivity. Depending upon the power of the applied beam, as well as the time interval used for bombardment, an upper portion 24-U of substrate 24 will exhibit an increased resistivity sufficient to provide current blocking. Alternatively, a p-type dopant may be introduced into the exposed surface 24S, which will also create a structure that confines the upward flow of electrons.

Figure 11:
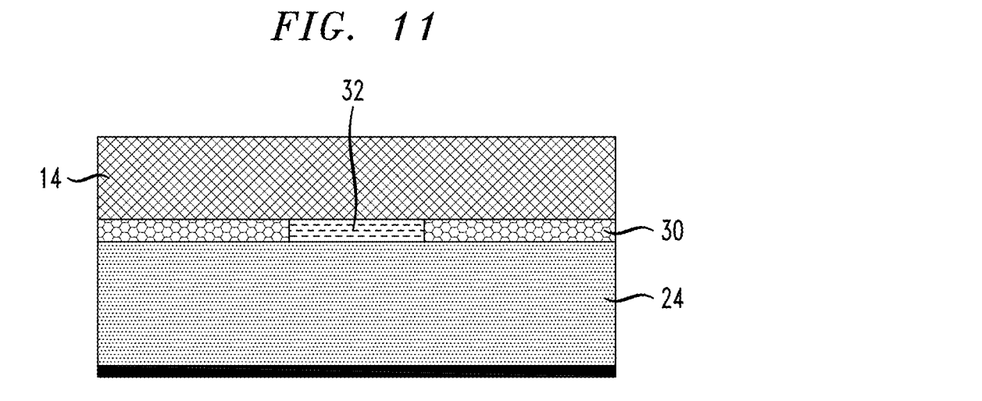
FIG. 11 depicts a following step in a fabrication process, with a first cladding layer of the edge-emitting semiconductor laser diode formed over the current blocking layer.

Once upper portion 24-U has been modified to form current blocking layer 30, mask 90 is removed and a conventional fabrication process of an edge-emitting semiconductor laser may proceed. FIG. 11 illustrates an initial step in an exemplary fabrication process as forming n-type cladding layer 14. Thus, similar to the configuration of FIG. 2, the steps described in FIGS. 10 and 11 result in forming a current blocking layer at an interface between the substrate and the n-type cladding layer.

Figure 12:
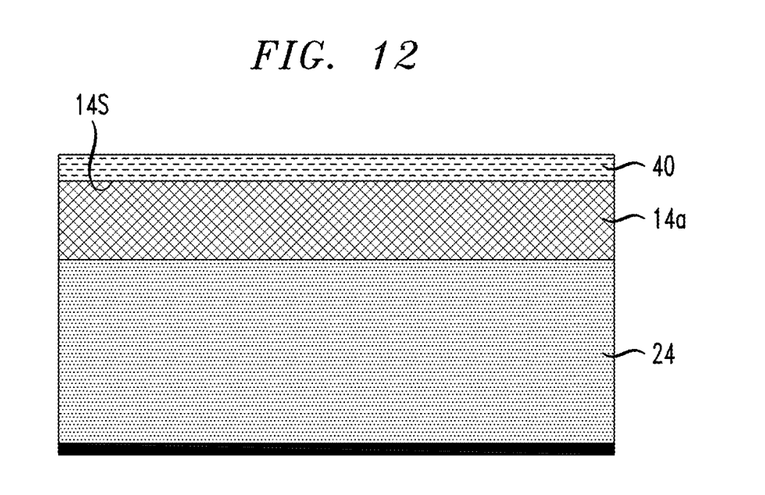
FIG. 12 depicts an initial set of fabrication steps for an alternative process of including a current blocking layer with an edge-emitting structure, in this case forming an initial thickness of the first cladding layer on the substrate, and then depositing the material of the current blocking layer on the cladding layer.

A slightly different fabrication process is required to position a current blocking layer (such as current blocking layer 40) as embedded within the material forming n-type cladding 14. FIGS. 12-15 show one exemplary set of processes that may be used to create an embedded current blocking layer. FIG. 12 shows an initial step, where a first portion 14a of n-type cladding layer 14 is formed on n-type substrate 24. While the formation of portion 14a is similar to the conventional process of forming the laser, the thickness of portion 14a is less than a conventional structure and is, in fact, controlled to define the location where embedded current blocking layer 40 is to be formed.

Figure 13:
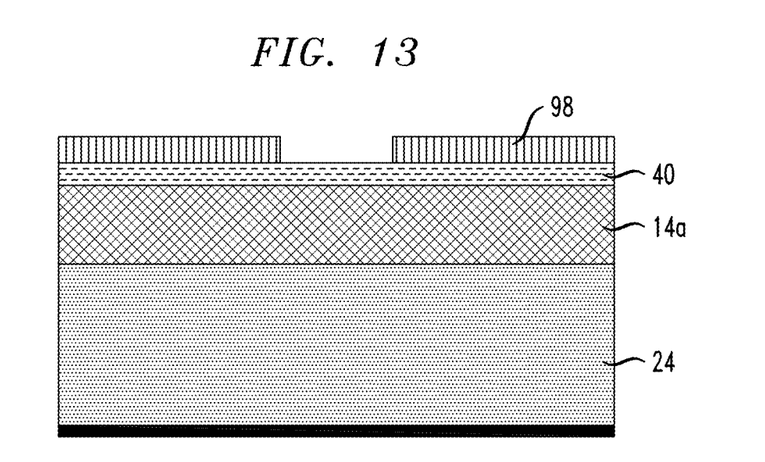
FIG. 13 depicts a following step of patterning the deposited current blocking material to define the central area where current is to be confined.

Indeed, the structure of FIG. 12 shows current blocking layer 40 as a p-type layer deposited over a top surface 14S of first portion 14a. Once current blocking layer 40 is in place, a patterning and etching process may follow to define the location and shape of opening 42. FIG. 13 shows the position of an etch mask 98 in place over current blocking layer 40, so that an appropriate etchant may be used to remove the exposed portion of layer 40 from the center of the structure.

Figure 14:
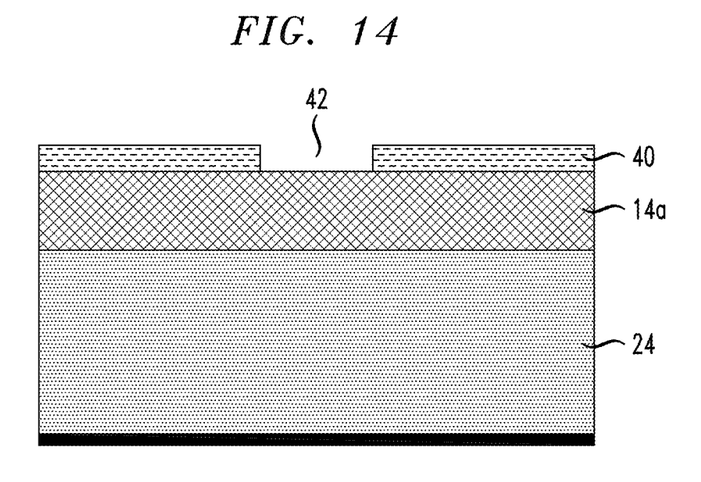
FIG. 14 shows a following step where the current blocking layer material has been removed (with the patterning layer also removed)
Figure 15:
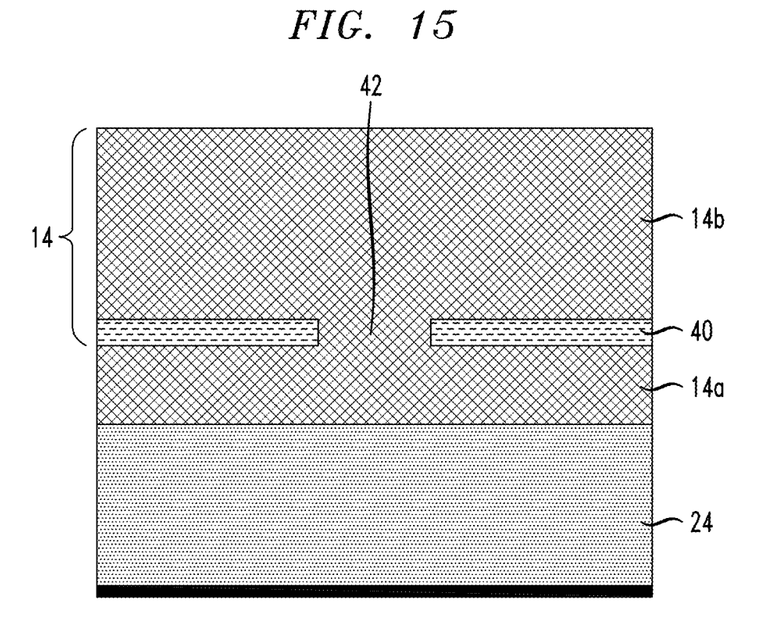
FIG. 15 shows a next step in the fabrication process, where the remaining of the desired thickness of the first cladding layer is formed over the current blocking layer.

FIG. 14 illustrates the structure remaining after the etching process, where current blocking layer 40 now includes a central opening 42. Subsequent to the creation of opening 42 in current blocking layer 40, the conventional device fabrication process is resumed, with the remaining desired thickness 14b of n-type cladding layer 14 deposited over current blocking layer 40 and forming the embedded structure as shown in FIG. 15. The conventional device fabrication process may then continue from this point forward, ultimately creating the structure as shown in FIG. 3.

Similar fabrication steps may be used to incorporate a current blocking layer in a VCSEL laser structure (e.g., form highly resistive layer, pattern, and etch to form central opening), or the multi-junction edge emitting device, as discussed above.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A semiconductor laser comprising:
    an active region for generating light output within a defined area of the active region in response to an electrical current passing therethrough;
    a semiconductor substrate;
    a lower cladding layer of a first conductivity type disposed between the semiconductor substrate and the active region;
    an upper cladding layer of a second, opposite conductivity type disposed over an exposed upper surface of the active region;
    a first ohmic contact disposed on the upper cladding layer;
    a second ohmic contact disposed on a exposed bottom surface of the semiconductor substrate;
    a front facet for emitting generated single mode light;
    a reflective rear facet, creating a laser cavity of length L with the front facet, the laser cavity comprising an amplifier portion adjacent to the front facet and a mode filter portion adjacent to the rear facet, the front and reflective rear facets disposed orthogonal to the first and second ohmic contacts; and
    a current blocking layer disposed within the lower cladding layer, including being disposed along an interface between a top surface of the semiconductor substrate and the lower cladding layer, the current blocking layer comprising a high resistivity material and formed to include a low resistivity central area substantially coinciding in location and topology with the light-generating defined area of the active region, guiding upward electron flow from the second ohmic contact away from the high resistivity regions of the current blocking layer and toward the low resistivity central area, the current blocking layer further configured to exhibit a wide central area of low resistivity in the amplifier portion of the laser cavity and a narrow central area of low resistivity in the mode filter portion of the laser cavity so as to assist in maintaining a single mode light output.

2. The semiconductor laser as defined in claim 1 wherein the first conductivity type comprises n-type conductivity and the second conductivity type comprises p-type conductivity.

3. The semiconductor laser as defined in claim 1 wherein the semiconductor laser further comprises
- a current confinement feature formed within the upper cladding layer between the first ohmic contact and the active region.

4. The semiconductor laser as defined in claim 1 wherein the current blocking layer comprises a separate, discrete layer formed over the top surface of the semiconductor substrate so as to be positioned at the interface between a top surface of the semiconductor substrate and the lower cladding layer.

5. The semiconductor laser as defined in claim 1 wherein the current blocking layer comprises a thickness of the semiconductor substrate that is treated to exhibit high resistivity.

6. The semiconductor laser as defined in claim 4 wherein the current blocking layer is formed of a conductivity opposite that of the lower cladding layer.

7. The semiconductor laser as defined in claim 1 wherein the current blocking layer is disposed within the lower cladding layer, so as to embedded within the lower cladding layer.

8. The semiconductor laser as defined in claim 7 wherein the lower cladding layer is defined as comprising a pair of sub-layers, with the current blocking layer positioned at an interface between the pair of sub-layers.

9. The semiconductor laser as defined in claim 1 wherein
- the first ohmic contact is formed to have a length less than L so as to remain withdrawn from the front and rear facets to create unpumped end sections; and
- the current blocking layer is formed such that its highly resistive material is at least coincident with the location of the unpumped end sections.

* * * * *